United States Patent
Zhang et al.

(10) Patent No.: US 12,132,147 B2
(45) Date of Patent: Oct. 29, 2024

(54) PATTERNED SUBSTRATE FOR LIGHT-EMITTING DIODE

(71) Applicant: BOLB INC., Livermore, CA (US)

(72) Inventors: Jianping Zhang, Livermore, CA (US); Ying Gao, Livermore, CA (US); Ling Zhou, Livermore, CA (US)

(73) Assignee: BOLB INC., Livermore, CA (US)

( * ) Notice: Subject to any disclaimer, the term of this patent is extended or adjusted under 35 U.S.C. 154(b) by 161 days.

(21) Appl. No.: 17/876,546

(22) Filed: Jul. 29, 2022

(65) Prior Publication Data

US 2024/0038929 A1 Feb. 1, 2024

(51) Int. Cl.
| | |
|---|---|
| *H01L 33/20* | (2010.01) |
| *H01L 33/06* | (2010.01) |
| *H01L 33/14* | (2010.01) |
| *H01L 33/32* | (2010.01) |

(52) U.S. Cl.
CPC .............. *H01L 33/20* (2013.01); *H01L 33/06* (2013.01); *H01L 33/145* (2013.01); *H01L 33/32* (2013.01)

(58) Field of Classification Search
CPC ....... H01L 33/20; H01L 33/06; H01L 33/145; H01L 33/32; Y10T 428/24942
See application file for complete search history.

(56) References Cited

U.S. PATENT DOCUMENTS

| | | | |
|---|---|---|---|
| 8,154,034 B1 * | 4/2012 | Zhang | H01L 33/0093 257/90 |
| 9,515,223 B2 * | 12/2016 | Hatta | H01L 33/50 |
| 9,660,140 B2 * | 5/2017 | Hirayama | H01L 21/02494 |

* cited by examiner

*Primary Examiner* — David Sample
*Assistant Examiner* — Donald M Flores, Jr.
(74) *Attorney, Agent, or Firm* — J.C. PATENTS

(57) ABSTRACT

A patterned substrate for light emitting diode includes a plurality of nodes and links protruding from a base plane of the substrate and base areas on the substrate, each pair of adjacent nodes is connected by a corresponding link, respectively. The nodes and links also can be concave nodes and concave links cutting into a surface of the substrate, each pair of adjacent concave nodes is connected by a corresponding concave link, respectively.

16 Claims, 14 Drawing Sheets

PATTERNED SUBSTRATE FOR LIGHT-EMITTING DIODE

FIELD OF THE INVENTION

The present invention relates in general to semiconductor light emitting diode and, more particularly, to a patterned substrate used for light-emitting diode with improved optical output power efficiency.

DESCRIPTION OF THE RELATED ART

Ultraviolet (UV) light-emitting diodes (LEDs) with optical emission wavelengths less than 360 nm are made of group-III nitride compound semiconductors such as AlGaN alloys. A typical UV LED includes an n-type AlGaN structure, a p-type AlGaN structure, and a light-emitting structure commonly made of AlGaN multiple-quantum-well (MQW) sandwiched in-between the n-type and p-type AlGaN structures. An AlGaN structure can be made of an AlGaN layer or many AlGaN layers joint forces to deliver a better function, such as to improve material quality, conductivity and/or carrier confinement. The Al-contents in the AlGaN layers/structures determines the optical emission wavelength of the LEDs. The optical emissions of wavelength less than 315 nm possess strong germicidal effect, making them ideal for food, water, air and surface disinfections.

As AlGaN being an optically dense material, light generated in the AlGaN structures has small escape probabilities into free space due to total internal reflections. This has limited the light extraction efficiency for short wavelength UV LEDs to be as small as 16% even for a fully transparent deep UV LED structure (Jianping Zhang et al 2022 Semicond. Sci. Technol. 37 07LT01).

In the past, U.S. Pat. No. 6,091,085 disclosed using surface/interface protrusions and/or depressions to scatter light out of LEDs, and in the following years, using patterned sapphire substrates made with periodic protrusions and depressions has been a common wisdom to improve the light extraction efficiency of group-III nitride based visible LEDs. These practices for examples can be found in the U.S. Pat. Nos. 9,012,936, 9,337,390, 9,385,275, 9,812,322, 9,947,830, 10,217,894, 10,312,409, et al. The contents of the above-mentioned US patents are herewith incorporated by reference in its entirety.

There are also efforts to make use of patterned sapphire substrates for UV LEDs, as seen in the U.S. Pat. Nos. 9,412,586, 9,660,140, 10,697,089. The contents of the above-mentioned US patents are herewith incorporated by reference in its entirety.

The prior art patterned sapphire substrate designs have been done via intuitive approaches without well-outlined design principles. For GaN based visible LEDs these intuitive designs can work well as GaN has a high lateral growth rate which makes the smooth epitaxy coalescence readily achievable. However, AlN is the preferred growth template for UV LEDs in view of the opaqueness of GaN to most of the UV emissions. AlN has very small lateral growth rate for typical epitaxial temperatures (500-1400° C.). In the prior art, the disclosed pattern sapphire substrate designs require large film thickness to make AlN coalesce, usually more than 5 μm even more than 10 μm. These thick AlN layers can cause large wafer bowing which makes mass-production wafer processing very difficult if not impossible. Therefore, there is need to design patterned sapphire substrate for UV LEDs.

SUMMARY OF THE INVENTION

One aspect of the present disclosure provides a substrate having a patterned surface for growing a light emitting diode. The substrate includes a plurality of nodes and links protruding from a base plane of the substrate and base areas on the substrate, wherein each pair of adjacent nodes is connected by a corresponding link, respectively, and the base areas are defined and exposed by the nodes and the links, wherein:

each node has a top surface and one or more sidewalls, the one or more sidewalls have an inclination angle with respect to the base plane of the substrate;

each link has a top surface of a rectangular shape and two sidewalls, the two sidewalls have an inclination angle with respect to the base plane of the substrate, and the links connect to the sidewall of the nodes, respectively;

an area of the top surface of each of the nodes is in the range of 0.01-12.56 μm$^2$, a width of the top surface of the links is in the range of 100-500 nm, a length of the top surface of the links is in the range of 300-3000 nm, a height between the base plane and the top surface of the nodes is in the range of 200-2000 nm, and a height between the base plane and the top surface of the links is in the range of 200-2000 nm; and a ratio of a total area of the top surface of the nodes and the top surface of the links to a total area of the top surface of the nodes, the top surface of the links, a projection area of the sidewalls of the nodes and links to the base plane, and the base areas is in the range of 30%-80%.

Another aspect of the present disclosure provides a substrate having a patterned surface for growing a light emitting diode. The substrate includes a plurality of concave nodes and concave links cutting into a surface of the substrate and base areas on the surface of the substrate, wherein each pair of adjacent concave nodes is connected by a corresponding concave link, respectively, wherein:

each concave node has a bottom surface and one or more sidewalls, the one or more sidewalls have an inclination angle with respect to a base plane of the substrate;

each concave link has a bottom surface of a rectangular shape and two sidewalls, the two sidewalls have an inclination angle with respect to the base plane of the substrate, and the two sidewalls of the concave links connect to the sidewalls of the concave nodes, respectively;

an area of the bottom surface of each of the concave nodes is in the range of 0.01-12.56 μm$^2$, a width of the bottom surface of the concave links is in the range of 100-500 nm, a length of the bottom surface of the concave links is in the range of 300-3000 nm, a height between the base plane and the bottom surface of the concave nodes is in the range of 200-2000 nm, and a height between the base plane and the bottom surface of the concave links is in the range of 200-2000 nm; and a ratio of a total area of the bottom surface of the concave nodes and the bottom surface of the concave links to a total area of the bottom surface of the concave nodes, the bottom surface of the concave links, a projection area of the sidewalls of the nodes and links to the base plane, and the base areas is in the range of 30%-80%.

This disclosure also provides a light emitting diode or a UV light emitting diode formed on the substrate described above.

BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

DETAILED DESCRIPTION OF EMBODIMENTS

Throughout the specification, the term group III nitride in general refers to metal nitride with cations selecting from group IIIA of the periodic table of the elements. That is to say, III-nitride includes AlN, GaN, InN and their ternary (AlGaN, InGaN, InAlN) and quaternary (AlInGaN) alloys. In this specification, a quaternary can be reduced to a ternary for simplicity if one of the group III elements is significantly small so that its existence does not affect the intended function of a layer made of such material. For example, if the In-composition in a quaternary AlInGaN is significantly small, smaller than 1%, then this AlInGaN quaternary can be shown as ternary AlGaN for simplicity. Using the same logic, a ternary can be reduced to a binary for simplicity if one of the group III elements is significantly small. For example, if the In-composition in a ternary InGaN is significantly small, smaller than 1%, then this InGaN ternary can be shown as binary GaN for simplicity. Group III nitride may also include small amount of transition metal nitride such as TiN, ZrN, HfN with molar fraction not larger than 10%. For example, III-nitride or nitride may include $Al_xIn_yGa_zTi_{(1-x-y-z)}N$, $Al_xIn_yGa_zZr_{(1-x-y-z)}N$, $Al_xIn_yGa_zHf_{(1-x-y-z)}N$, with $(1-x-y-z) \leq 10\%$.

As well known, light-emitting devices such as light-emitting diodes (LEDs) commonly adopt a light-emitting structure containing a quantum well active region, an n-type group III nitride structure for injecting electrons into the active region, and a p-type group III nitride structure on the other side of the active region for injecting holes into the active region. This light-emitting structure is generally formed over a transparent substrate. Even though being transparent to the light generated in the light-emitting structure, the substrate can be of different (usually smaller) optical refractive index.

Figure 1:
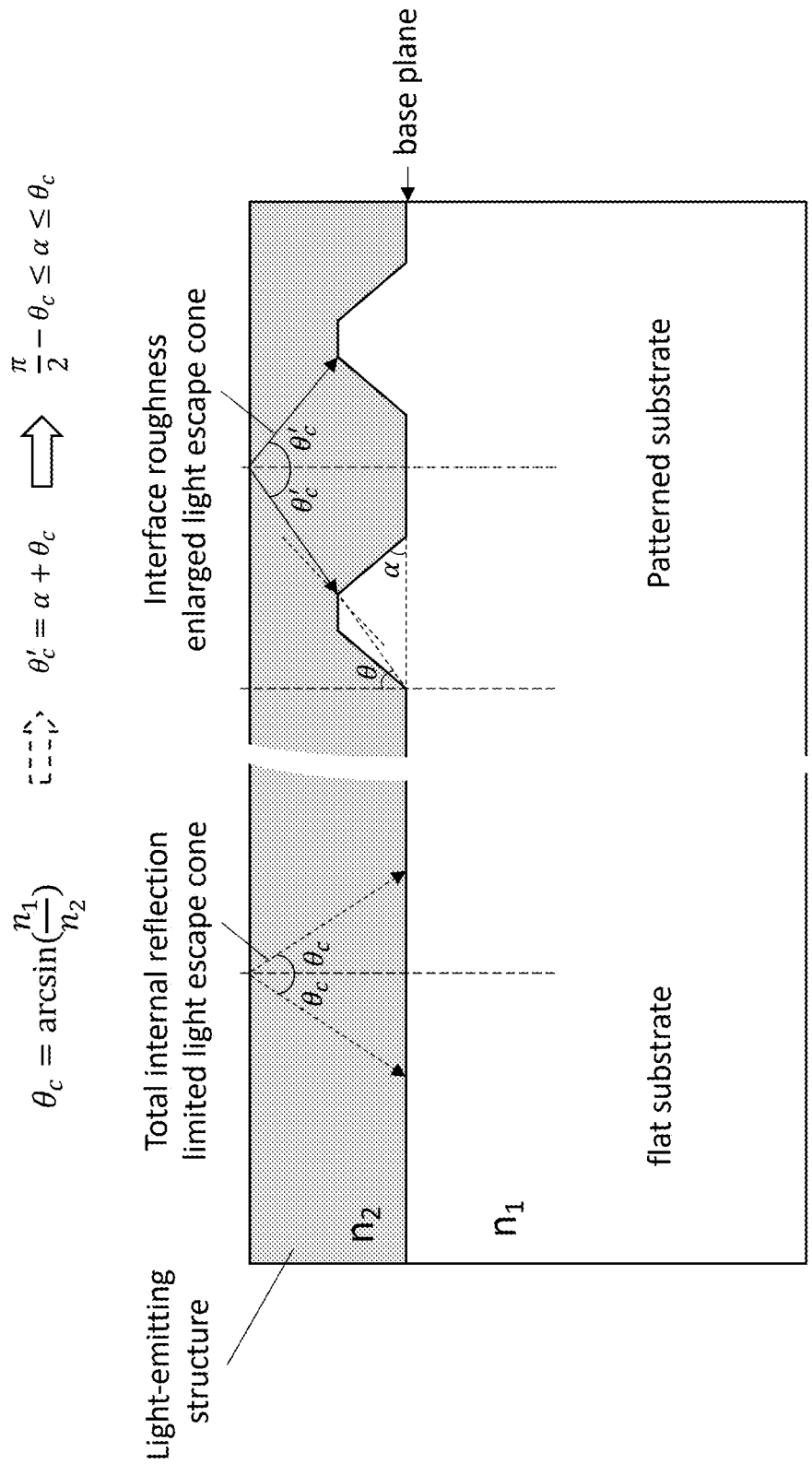
FIG. 1 illustrates an enlarged light escape cone for a patterned substrate as compared to a light escape cone for a flat substrate.

Refer to FIG. 1, where the left side illustrates a light-emitting structure formed over a base plane of a flat transparent substrate. A base plane of a substrate is its main surface plane to receive epitaxial growth. For nitride LEDs formed on sapphire substrate, the base plane of the substrate is usually a c-plane of sapphire. When the refractive index of the light-emitting structure ($n_2$) is larger than the refractive index of the substrate ($n_1$), light emitted within any point of the light-emitting structure can only be transmitted into the substrate within a light escape cone of a cone angle limited by the total internal reflections and equal to twice of the critical angle $\theta_c$, which is determined by the light total internal reflection taking place at the interface of the two optical media and defined as $$\theta_c = \arcsin\left(\frac{n_1}{n_2}\right).$$

The right side of FIG. 1 illustrates a light-emitting structure formed over a transparent patterned substrate, containing many surface protrusions. The protrusions are made of the same material as that of the substrate, possessing sidewalls of angle of inclination cc with respect to the base plane of the substrate. As a result, the light escape cone angle is enlarged to be $2\theta'_c$, where $\theta'_c = \alpha + \theta_c$. A first aspect of the present disclosure is to optimize the inclination angle cc. First, consider light rays of angle of incidence $\theta$ with respect to the base plane for $$\frac{\pi}{2} \geq \theta \geq \theta_c$$

(these rays could not escape light-emitting structure when hitting the base plane). When these rays hit the sidewalls of the protrusions, the incidence angle changes into $\theta' = \theta - \alpha$, in order for these rays to be transmitted into substrate, one needs $\theta' = \theta - \alpha \leq \theta_c$, i.e., $\alpha \geq \theta - \theta_c$. This means when $$a \geq \frac{\pi}{2} - \theta_c,$$

light rays of angle of incidence $\theta$ with respect to the base plane for $$\frac{\pi}{2} \geq \theta \geq \theta_c$$

will be transmitted into the substrate via the protrusion sidewalls. Second, consider light rays of angle of incidence θ with respect to the base plane for $\theta_c \geq \theta \geq 0$ (these rays will escape light-emitting structure when hitting the base plane). When these rays hit the side walls of the protrusions, the incidence angle changes into θ=α−θ, in order for these rays to be transmitted into the protrusions, one needs θ'=α−θ≤$\theta_c$, i.e., α≤$\theta_c$+θ. This means when α≤$\theta_c$, light rays of angle of incidence θ with respect to the base plane for $\theta_c \geq \theta \geq 0$ can also be transmitted into the substrate via the protrusion sidewalls. So, in combination, when $$\frac{\pi}{2} - \theta_c \leq \alpha \leq \theta_c,$$

the protrusions can maximize the light extraction efficiency for LEDs. For GaN based visible LEDs formed on patterned sapphire substrate, if taking $n_2$=2.45, $n_1$=1.78, this requires 43.4°≤α≤46.6°. For AlN based deep UV LEDs formed on patterned sapphire substrate, if taking $n_2$=2.25, $n_1$=1.75, this requires 38.9°≤α≤51.1°. To compensate the uncertainty of the actual optical refractive indices, for nitride base LEDs formed on patterned sapphire substrate, according to the present disclosure, the inclination angle of the protrusions with respect to the base plane is optionally to be within 35-55°, or 37-53°.

Figure 2:
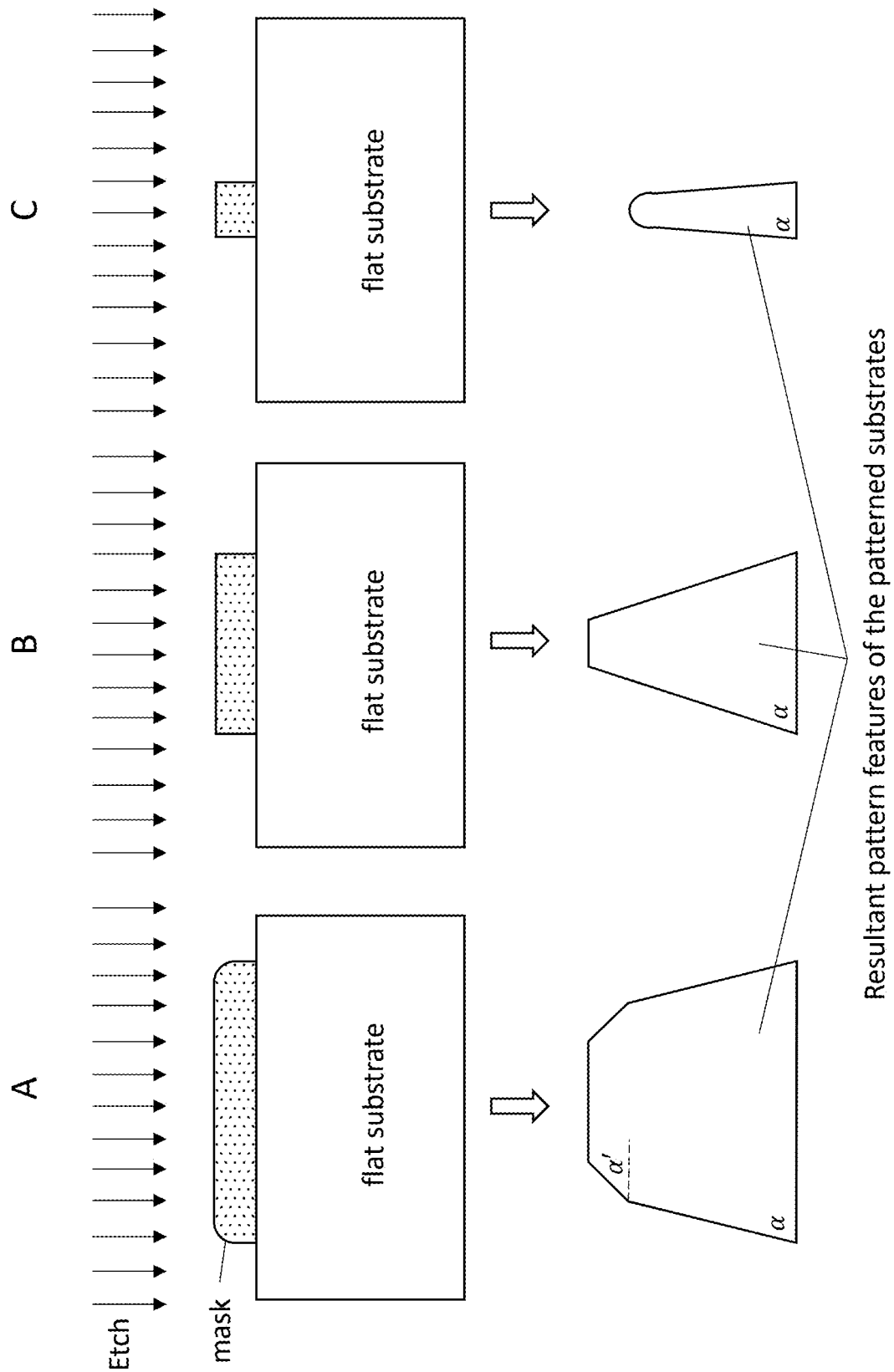
FIG. 2 illustrates the effect of the size, thickness and thickness profile of a mask on the side wall profile of the formed pattern features on a patterned substrate.

The protrusion sidewall inclination angle α can be controlled and realized via etching (dry or wet) and photolithography mask selection. Refer to FIG. 2, to form etch patterns onto a substrate, a photolithography mask layer is formed on the substrate. The photolithography mask can protect the substrate materials beneath the mask during etching process. However, once the substrate materials surrounding the mask have been etched away, the substrate materials beneath the mask form a protrusion with sidewalls and the sidewalls are exposed and susceptible to lateral etching to form slanted sidewalls. Further, the mask edge is also susceptible to lateral etching which will shrink the mask laterally and vertically. This means the mask thickness profile can also affect the protrusion sidewall inclination angle. These combined effects will make the lateral size of the top portion of the protrusion smaller than the lateral size of the original mask. To summarize, the mask size, mask thickness profile, and etch time can be selected to produce substrate protrusions with desired sidewall inclination angle.

Figure 3:
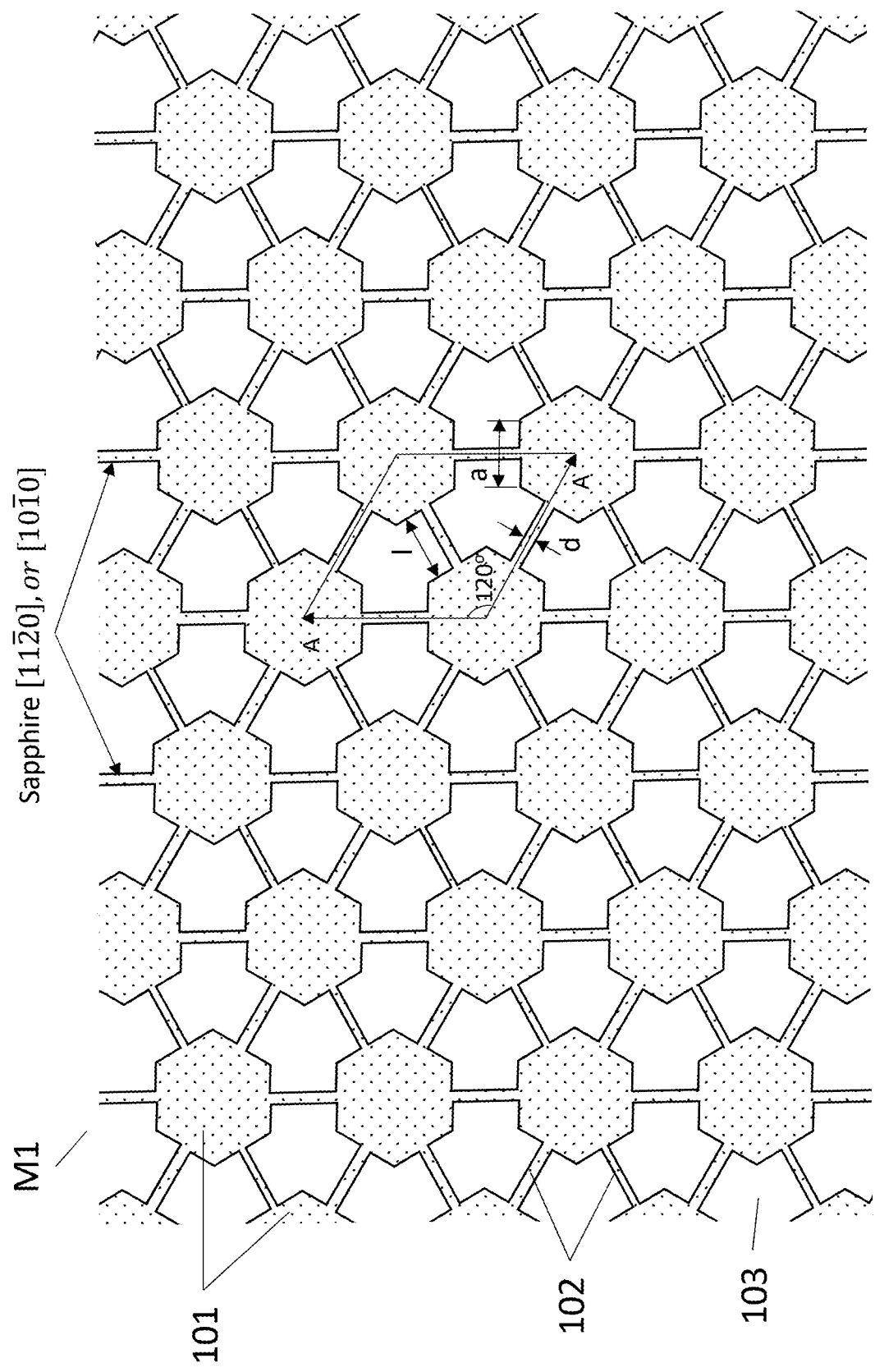
FIG. 3 illustrates a photolithography mask design M1 to make patterned substrate according to an embodiment of the present disclosure.

Shown in FIG. 3 is an illustrated plan view of a photolithography mask design M1 according to one aspect of the present disclosure. As seen, mask M1 geometrically is formed via translating a unit cell to fully cover a plane. The unit cell of mask M1 is a rhombus of side length A and an interior angle 120°. The unit cell consists of hexagonal nodes 101, rectangular links 102, and the complementary area 103 (Mathematically, the unit cell consists of one node 101 and three links 102). In the following description for simplicity, it is assumed that the node and link areas are covered by mask material to prevent etching and the complementary areas are exposed for etching, but obviously the opposite case can be allowed too, i.e., the complementary areas to be protected while the node and link areas to be etched. In mask M1, the node is a hexagon of side length a and the link is a perpendicular bisector of width d to the side of the hexagon. Therefore, the length l of the link is A−√3α. The unit cell interior angle selection is to accommodate the wurtzite crystal structure of group-III nitrides. As shown, the links are optionally to run along the substrate (e.g.: sapphire) [11$\bar{2}$0] or [10$\bar{1}$0] direction.

With these parameters, one can calculate the masked area filling factor within a unit cell (area ratio of the masked area to the total area of the unit cell) and the interior perimeter ratio of the unit cell to its composing node (for simplicity, these will be called as filling factor (FF) and perimeter ratio (PR) in short in the following description of this disclosure). Then the calculated filling factor and perimeter ratio are also those for the whole mask M1 as mask M1 is formed by translating these unit cells to cover a plane. And we have $$FF = \frac{3a^2 + 2\sqrt{3}\,dA - 6da}{A^2} \text{ and } PR = \frac{A + (1-\sqrt{3})a - d}{a},$$

and for d=0, PR=1 (by PR definition).

The filling factor and perimeter ratio are important for patterned substrate design according to one aspect of the present invention. The filling factor gives a good estimation on the percentage of area left on the substrate to receive epitaxial growth, and the perimeter ratio affects the sidewall area for light extraction enhancement, as upon etch, the mask perimeter will define protrusion sidewalls. If the filling factor is too small, smooth coalescent epitaxial growth would be difficult to obtain. If the perimeter ratio is too small, the patterned substrate will not contribute to light extraction too much. The mask design M1 introduces links 102 in-between nodes 101 to balance filling factor and perimeter ratio for good pattern substrate fabrication.

Figure 4:
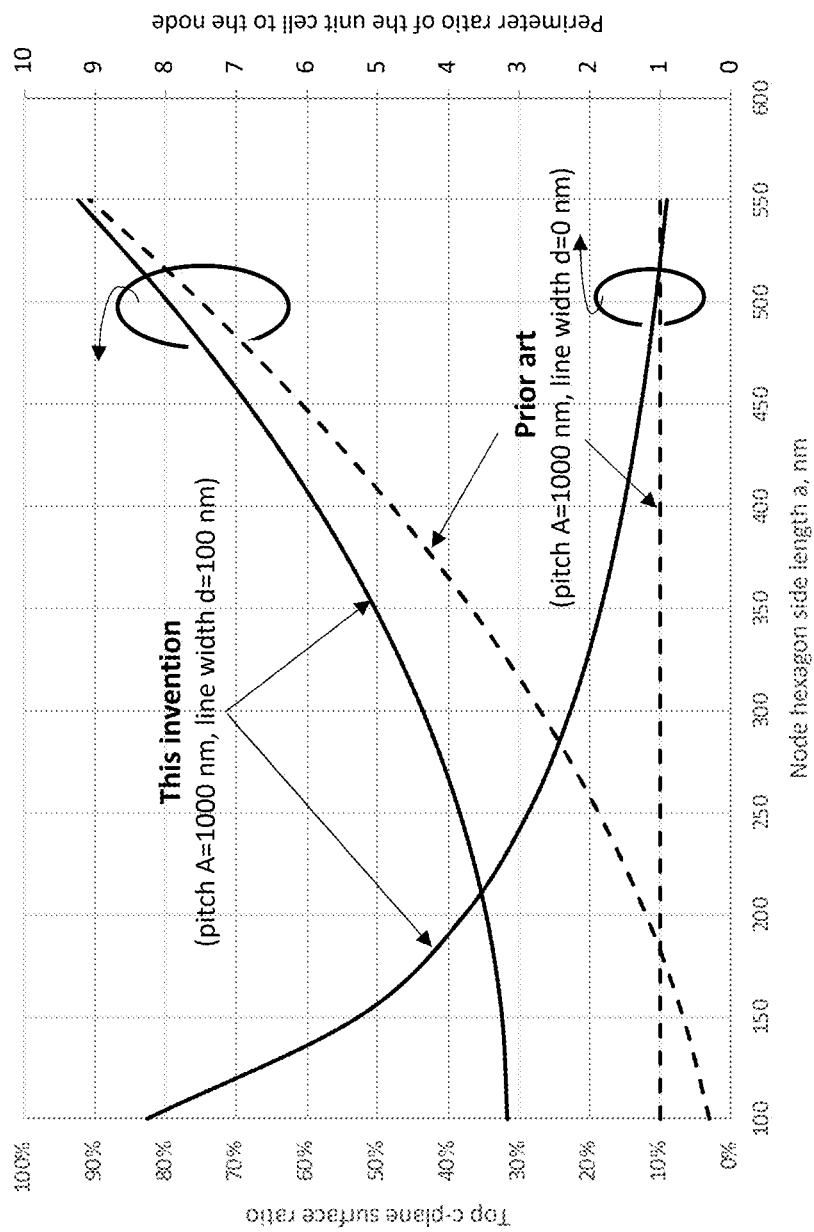
FIG. 4 compares the filling factors and perimeter ratios of masks according to mask design M1 and a design from the prior art.

As examples to elucidate the principle of the present disclosure, FIG. 4 compares the filling factors and perimeter ratios of masks according to mask design M1 and a design from the prior art. Here the unit cell side length A (also called pitch A) is set to be 1000 nm while allowing the node hexagon side length a to vary between 100-550 nm. And the link width d for the designs according to the prior art and the present disclosure are 0 (i.e., no links) and 100 nm, respectively. As seen, for the designs without links, the perimeter ratio of the unit cell to its composing node equals 1 regardless of the size of the node, while the filling factor increases monotonically (from 3% to 90.75%) with the size of the node. This means that in order to have good light extraction efficiency, it is best to use the ones of small filling factors (i.e., 0<FF<30%), which is not a problem for epitaxy of good lateral growth rate (i.e., GaN epitaxy), but could be a problem for epitaxy of small lateral growth rate (i.e., AlN epitaxy). The epitaxy of GaN on c-plane sapphire can have a lateral/vertical growth rate ratio as high as 4, while the epitaxy of AlN on c-plane sapphire only possesses lateral/vertical growth rate ratio as small as 0.2 from our observations. That is why the conventional patterned sapphire substrates work well for GaN epitaxy, but are not suitable for AlN epitaxy (too difficult to coalesce).

Also seen, for the designs with links, the perimeter ratio of the unit cell to its composing node reduces from 8.27 to 0.9 while the filling factor increases from 31.64% to 92.39% with the size of the node increases from 100 to 550 nm. The patterned substrates according to this disclosure add links to the nodes, increasing the filling factors and adding more protrusion sidewalls which facilitate coalescence as well as enhance light extraction. Refer to FIG. 4, for the same node size, the designs according to this invention have larger filling factors and much larger perimeter ratios for most of the node sizes. For example, for the node of side length of 100 nm, the conventional design gives a filling factor and perimeter ratio of 3% and 1, respectively; while the design according to this invention delivers a filling factor and perimeter ratio of 31.64% and 8.27, respectively. Moreover, for the node of side length of 350 nm, the conventional design gives a filling factor and perimeter ratio of 36.75% and 1, respectively; while the design according to this invention delivers a filling factor and perimeter ratio of 50.39% and 1.84, respectively.

According to another aspect of the present disclosure, the preferred filling factors and perimeter ratios are optionally to be in the ranges of 30-80% such as 40-70%, 50-60% and 1-10 such as 2-8, 4-6, respectively. For the filling factors and perimeter ratios to be in the preferred ranges, the pitch A, node hexagon side length a, and the link width d are optionally in the ranges of 500-3000 nm (such as 800-2500 nm, 1000-2000 nm), 0-2000 nm (such as 100-1500 nm, 200-1000 nm), and 100-500 nm (such as 150-400 nm, 200-300 nm), respectively.

Figure 5A:
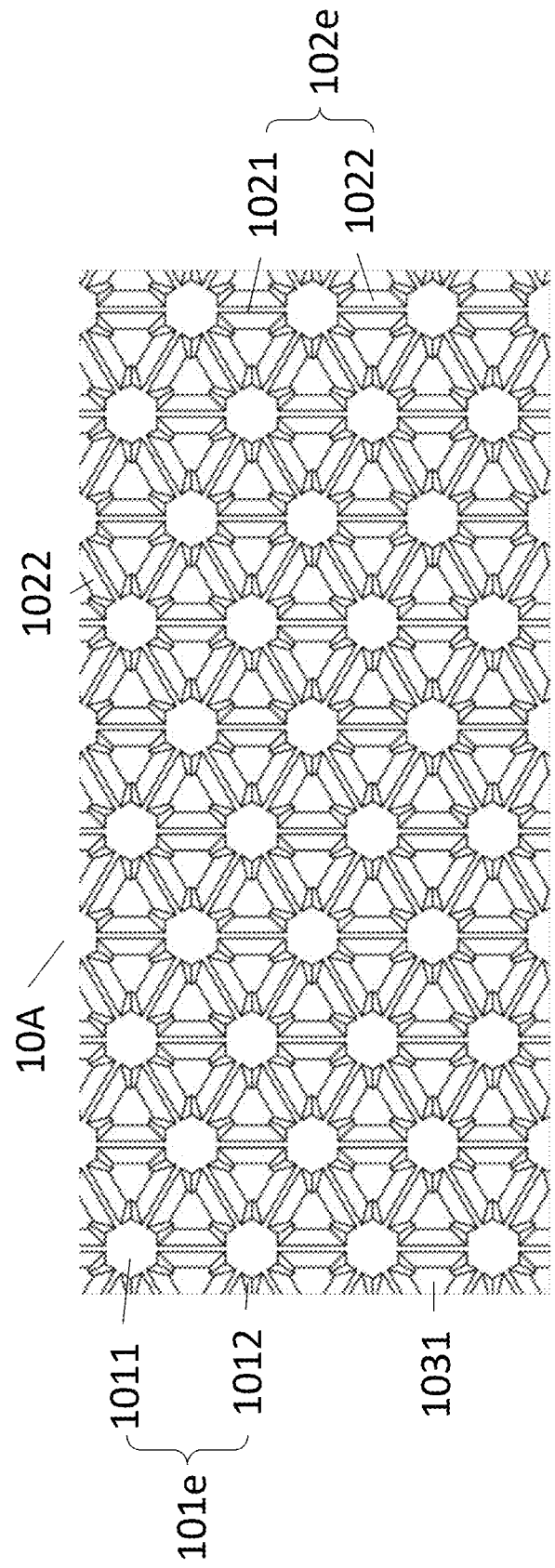
FIG. 5A illustrates a plan view of a portion of a patterned substrate made using a photolithography mask according to FIG. 3.
Figure 5B:
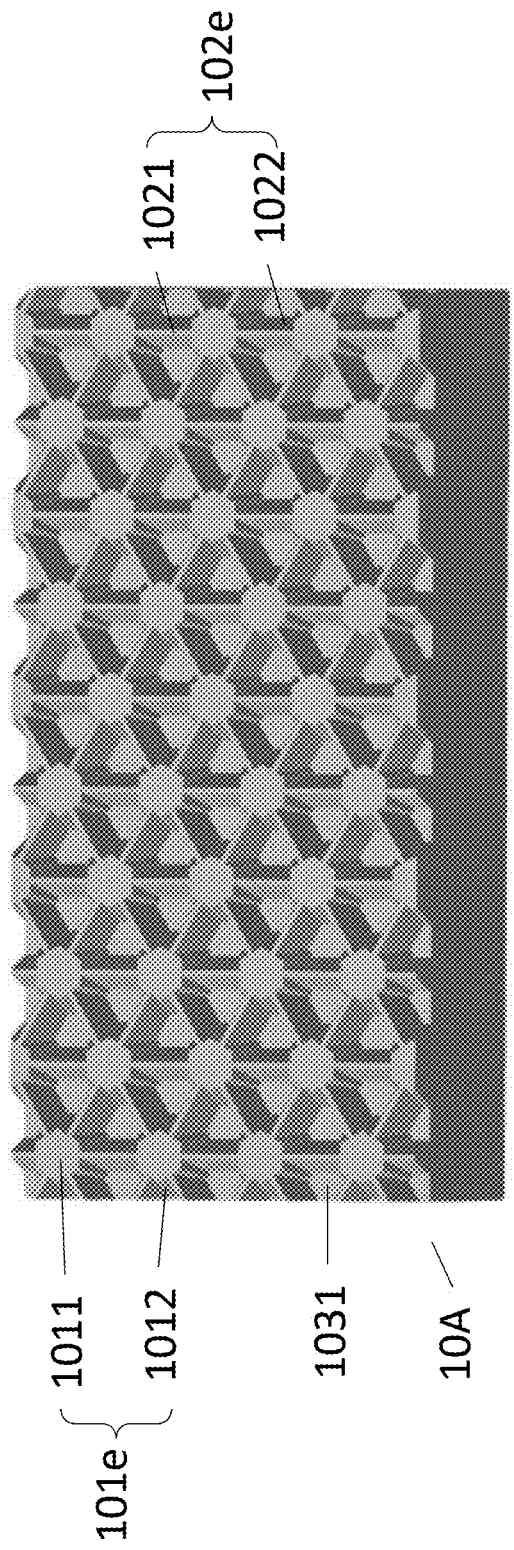
FIG. 5B illustrates a perspective view of a patterned substrate shown in FIG. 5A.

FIG. 5A and FIG. 5B respectively illustrate a plan view and a perspective view of a portion of a patterned substrate 10A made using a photolithography mask M1 according to FIG. 3. As seen, upon etching, the patterns of mask M1 are transferred to the substrate 10A. Because of the mask nodes 101, links 102 and complementary areas 103, upon etching, on a surface of substrate 10A there form nodes 101e, links 102e and etch-formed base areas 1031. Nodes 101e contain unetched top surfaces 1011 and etch-formed sidewalls 1012. Links 102e contain unetched top surfaces 1021 and etch-formed sidewalls 1022. Top surfaces 1011 and 1021 provide growth surface for epitaxy, once the grown layers on the neighboring top surfaces 1011 and 1021 coalesce, a smooth coalescent epitaxial layer is obtained for the following device structure formation. It is noted that growth will also take place on the base areas 1031 and sidewalls 1012 and 1022, but the growth rate there will be slower and finally be suppressed by the growths on the top surfaces 1011 and 1021. The sidewalls 1012 and 1022 will enlarge the light escape cone angle and improve light extraction efficiency. The present invention provides additional links 102e on patterned substrates therefore improves growth coalescence and light extraction efficiency at the same time. Note that because of side etching effect, some dimensions of the patterns transferred from mask M1 to substrate 10A will be modified (shrunk). For example, the lateral size of the top surfaces 1011 and the width of top surfaces 1021 would be smaller than those of the nodes 101 and links 102. Still, according to another aspect of the present disclosure, the preferred filling factors and perimeter ratios of the top surfaces 1011 and 1021 are optionally to be in the ranges of 30-80% and 1-10, respectively. For the filling factors and perimeter ratios to be in the preferred ranges, the pitch, top surface 1011 side length, and top surface 1021 width are optionally in the ranges of 500-3000 nm, 0-2000 nm, and 100-500 nm, respectively. The height between the top surfaces 1011/1021 and the base areas 1031 is optionally in the range of 200-2000 nm, or 500-1500 nm.

Figure 6:
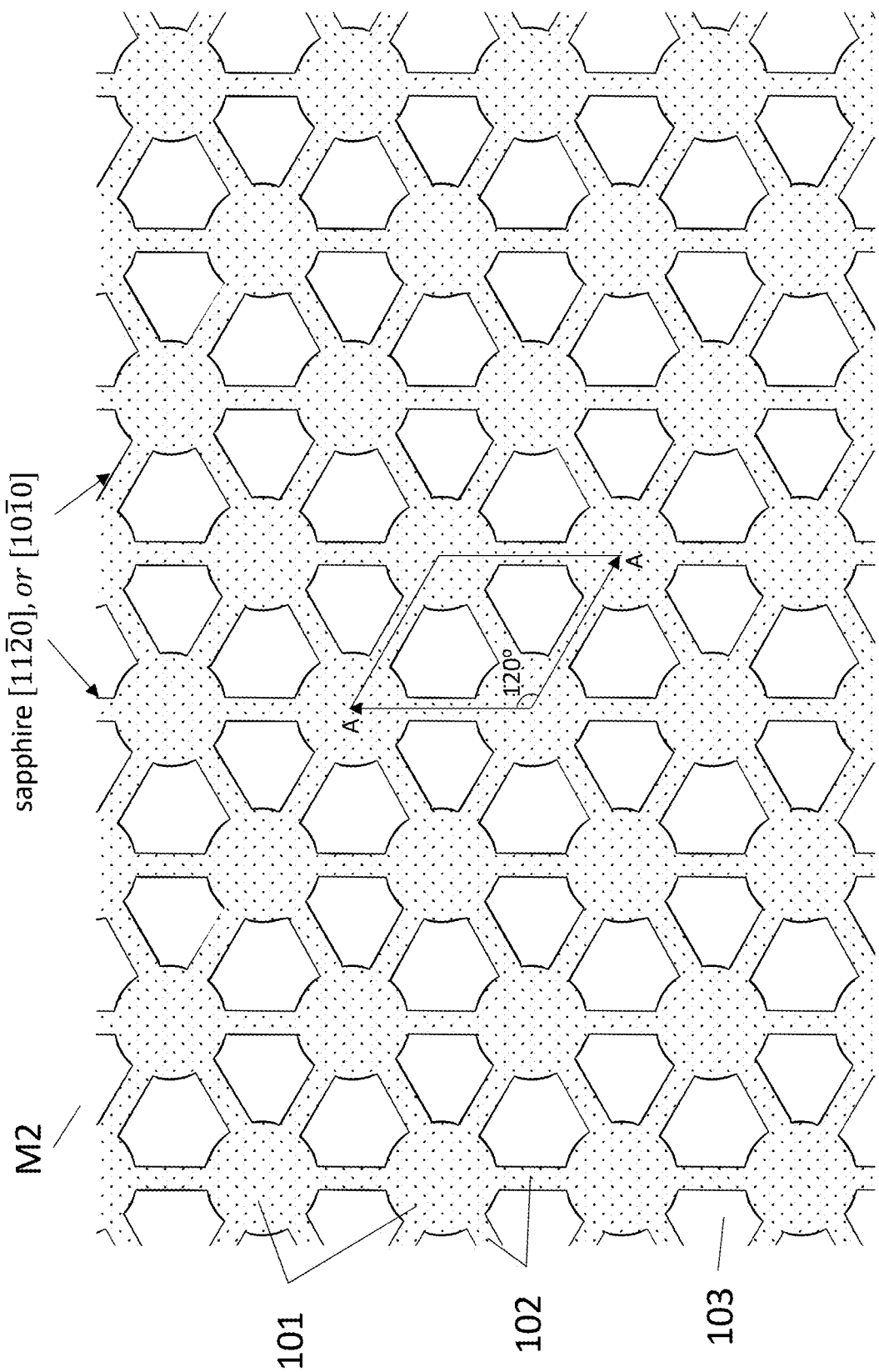
FIG. 6 illustrates a photolithography mask design M2 to make patterned substrate according to an embodiment of the present disclosure.
Figure 7A:
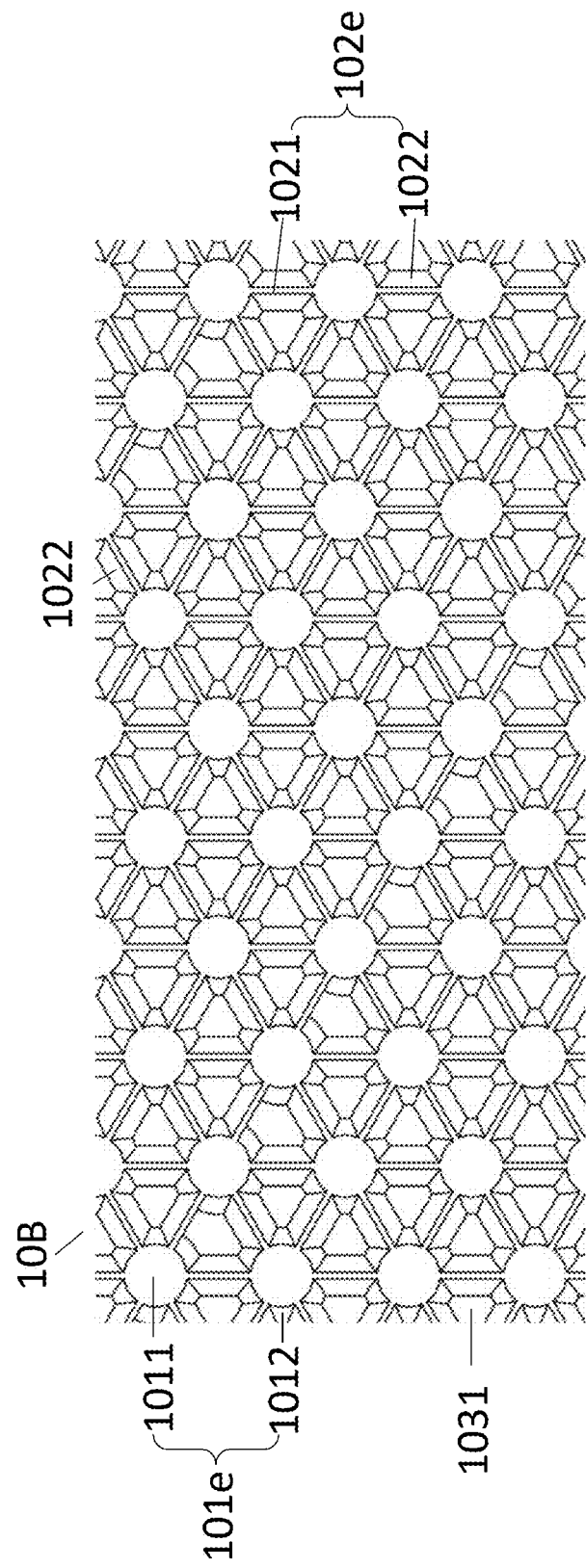
FIG. 7A illustrates a plan view of a portion of a patterned substrate made using a photolithography mask according to FIG. 6.
Figure 7B:
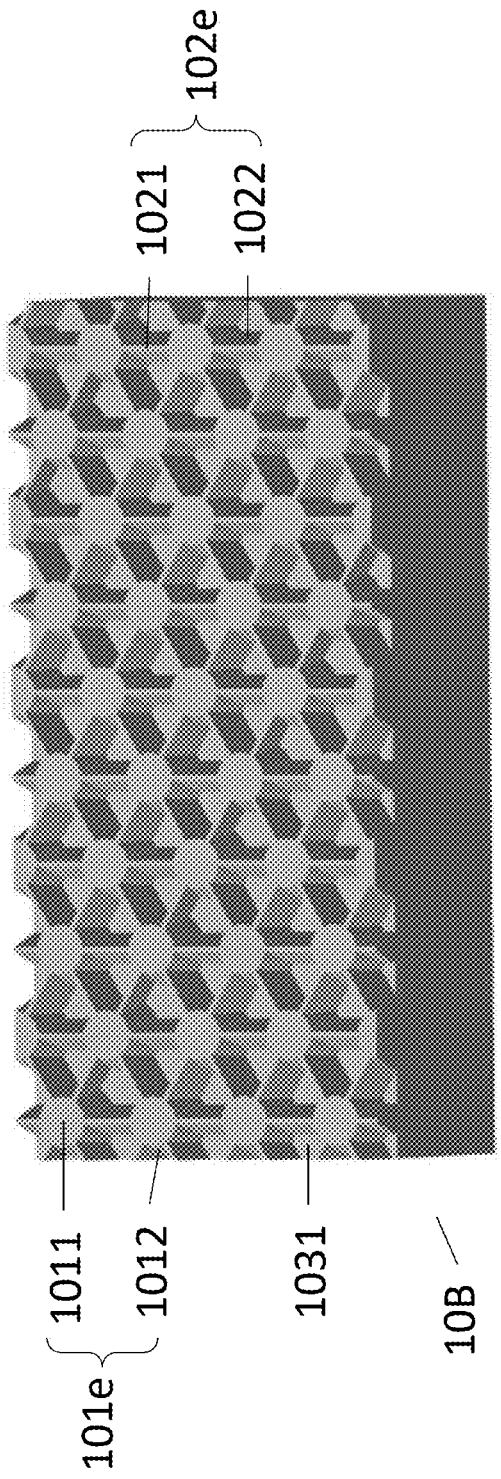
FIG. 7B illustrates a perspective view of a patterned substrate shown in FIG. 7A.

FIG. 6 illustrates a photolithography mask design M2 to make patterned substrate according one aspect of the present disclosure. Mask design M2 is similar to the mask design M1, except that nodes 101 are circular instead of hexagonal. FIG. 7A and FIG. 7B respectively illustrate a plan view and a perspective view of a portion of a patterned substrate 10B made using a photolithography mask M2 according to FIG. 6. Still, according to another aspect of the present disclosure, the preferred filling factors and perimeter ratios of the top surfaces 1011 and 1021 are optionally to be in the ranges of 30-80% and 1-10, respectively. For the filling factors and perimeter ratios to be in the preferred ranges, the pitch, top surface 1011 radius, and top surface 1021 width are optionally in the ranges of 500-3000 nm, 0-2000 nm, and 100-500 nm, respectively. The height between the top surfaces 1011/1021 and the base areas 1031 is optionally in the range of 200-2000 nm, or 500-1500 nm.

Figure 8:
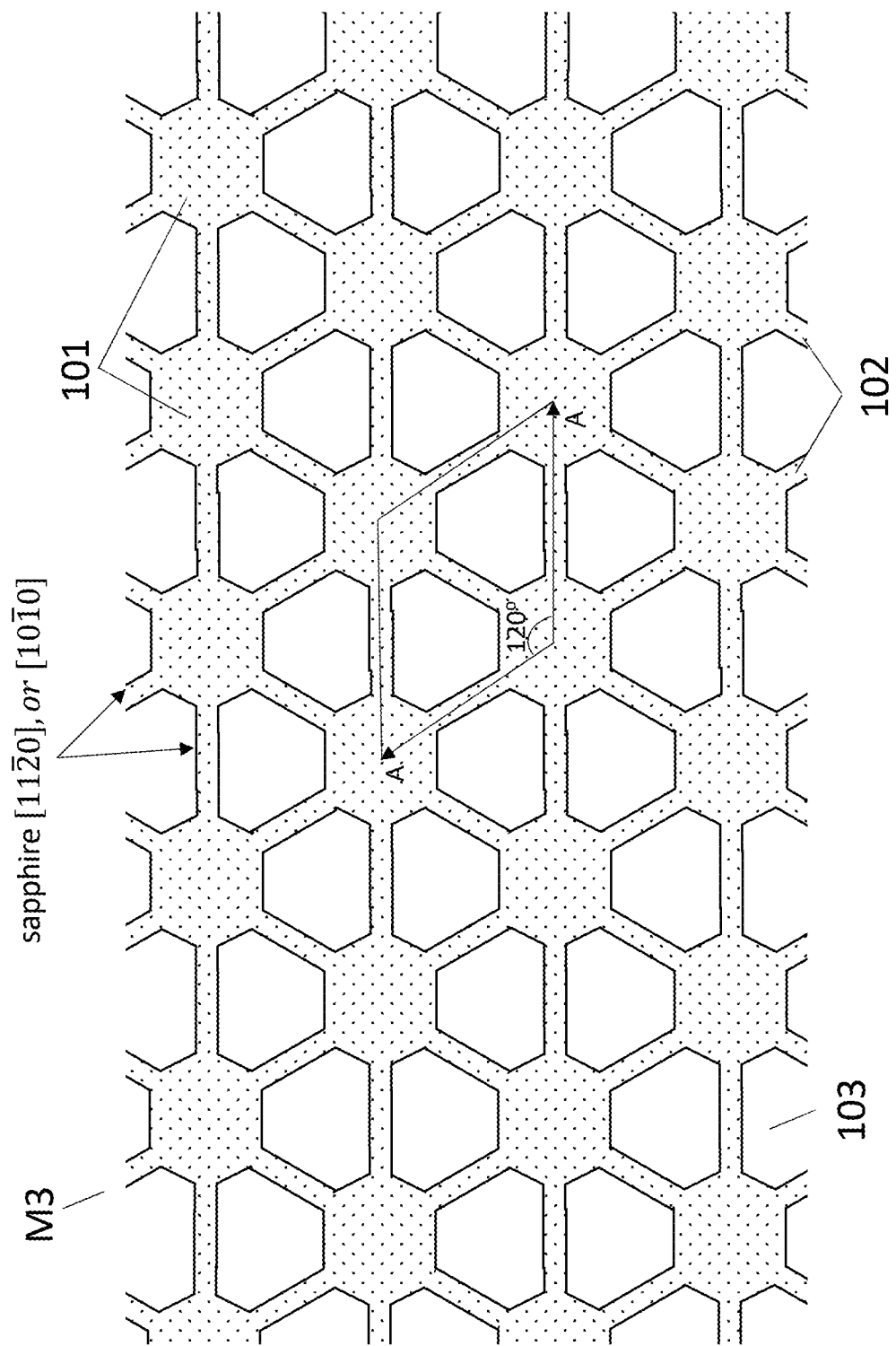
FIG. 8 illustrates a photolithography mask design M3 to make patterned substrate according to an embodiment of the present disclosure.

FIG. 8 illustrates a photolithography mask design M3 to make patterned substrate according one aspect of the present disclosure. Mask design M3 is similar to the mask design M1, except that links 102 connect the vertices instead of the sides of the hexagon nodes.

Figure 9:
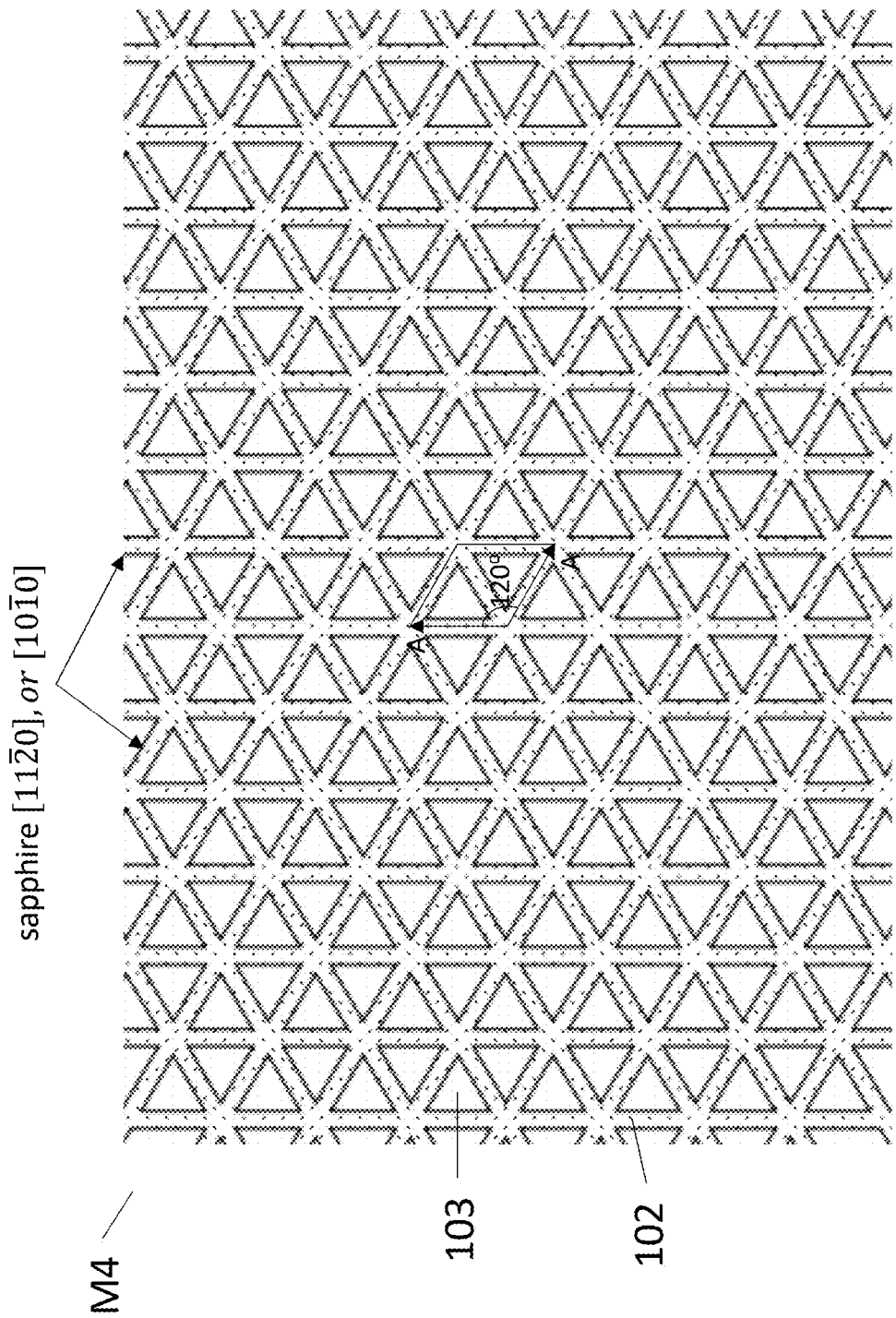
FIG. 9 illustrates a photolithography mask design M4 to make patterned substrate according to an embodiment of the present disclosure.
Figure 10A:
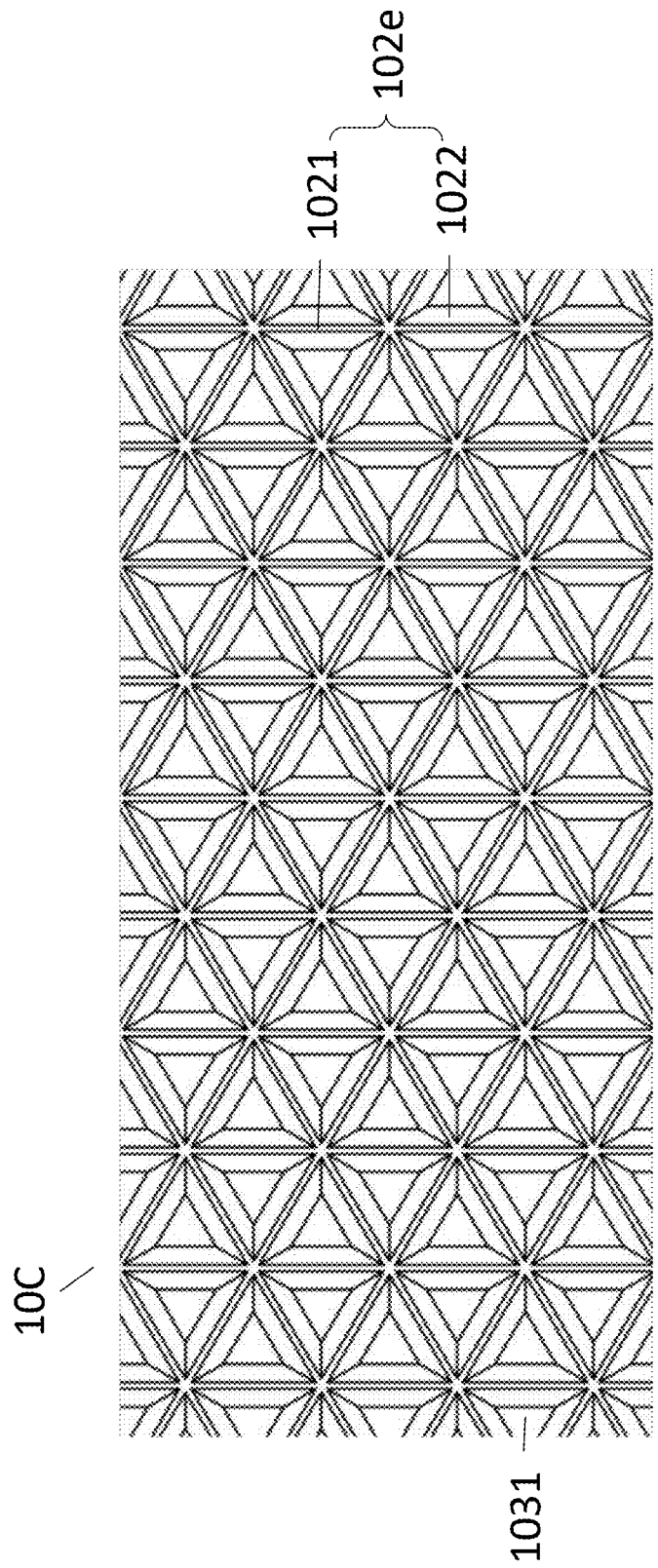
FIG. 10A illustrates a plan view of a portion of a patterned substrate made using a photolithography mask according to FIG. 9.
Figure 10B:
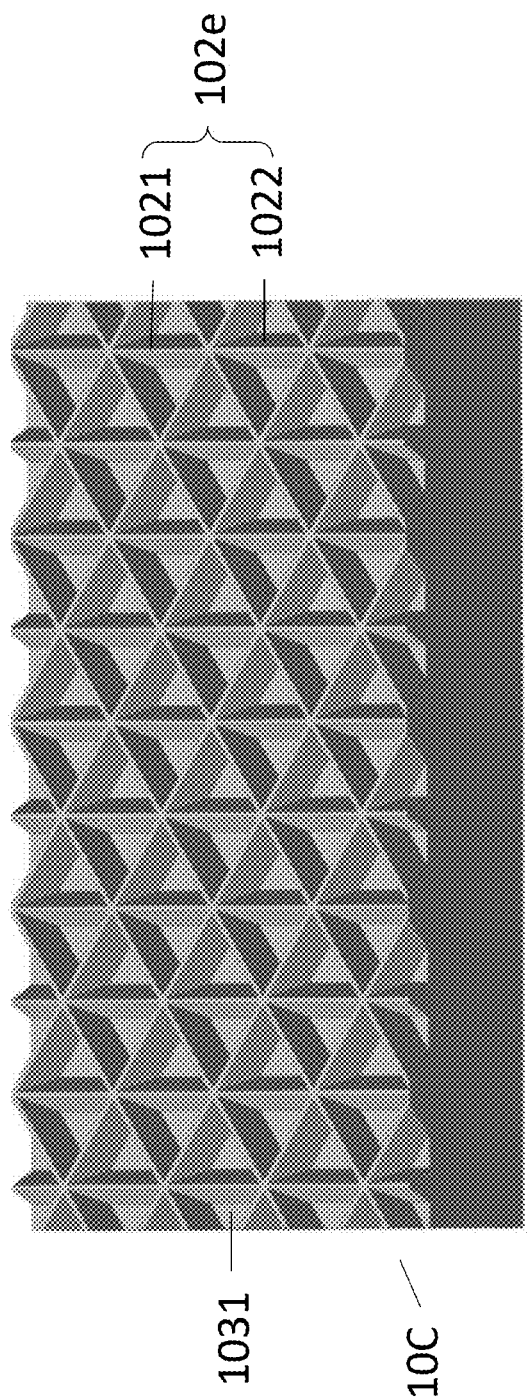
FIG. 10B illustrates a perspective view of a patterned substrate shown in FIG. 10A.

FIG. 9 illustrates a photolithography mask design M4 to make patterned substrate according one aspect of the present disclosure. Mask design M4 is similar to the mask design M1, except that nodes 101 vanish. FIG. 10A and FIG. 10B respectively illustrate a plan view and a perspective view of a portion of a patterned substrate 10C made using a photolithography mask M4 according to FIG. 9. Still, according to another aspect of the present disclosure, the preferred filling factors and perimeter ratios of the top surfaces 1021 are optionally to be in the ranges of 30-80% and 1-10, respectively. For the filling factors and perimeter ratios to be in the preferred ranges, the pitch and top surface 1021 width are optionally in the ranges of 500-3000 nm and 100-800 nm, respectively. The height between the top surfaces 1021 and the base areas 1031 is optionally in the range of 200-2000 nm, or 500-1500 nm.

It is noted that even though in the above description it is assumed that the masked area is shielded from etching, one can use mask designs M1-M4 to make reverse masks where the areas under the nodes and links are actually etched away and the complementary areas instead are protected from etching.

It should be understood that the patterned substrate according to this disclosure is not limited to the embodiments described above. In general, the patterned substrate for light emitting diode includes a plurality of nodes and links protruding from a surface of the substrate on which the LED layers grow. Each pair of adjacent nodes is connected by a corresponding link, respectively. Depending on the shape of the nodes and configuration of the node-link pattern, each node connects to multiple links on its sidewalls. The nodes and links can be evenly or unevenly distributed on the substrate surface, the size and shape of different nodes can be the same or different. Evenly distributed nodes and links on the substrate surface mean that the pattern on the substrate surface is formed by repeating a unit cell such as unit cell A shown in FIG. 3. The base areas are formed on a base plane of the substrate during the etching process of the nodes and links, and the base areas are defined and exposed by the nodes and the links. A base plane of a substrate is its main surface plane to receive epitaxial growth. For nitride LEDs formed on sapphire substrate, the base plane of the substrate is usually a c-plane of sapphire.

Each node has a top surface and one or more sidewalls, the one or more sidewalls have an inclination angle with respect to the base plane of the substrate. Each link has a top surface of a rectangular shape and two sidewalls, the two sidewalls have an inclination angle with respect to the base plane of the substrate, and the links connect to the sidewalls of the nodes, respectively. The inclination angle of the sidewalls of the nodes can be smaller, bigger, or equal to the inclination angle of the sidewalls of the links. Preferably, the sidewalls of the nodes and the links have a substantially flat surface. The top surface of the nodes and the links can be a flat top surface parallel to the base plane of the substrate. The top surfaces of the nodes and the links are preferably smooth and suitable for epitaxial growth.

The area of the top surface of each of the nodes can be in the range of 0.01-12.56 µm², the edge length a of the top surface of each node can be in the range 0-2000 nm, such as 100-550 nm, a width of the top surface of the links is in the range of 100-500 nm, such as 150-450 nm, 200-400 nm, 250-350 nm, a length of the top surface of the links is in the range of 300-3000 nm, such as 500-2500 nm, 1000-2000 nm, a height between the base plane and the top surface of the nodes is in the range of 200-2000 nm, such as 500-1500 nm, 800-1200 nm, and a height between the base plane and the top surface of the links is in the range of 200-2000 nm, such as 500-1500 nm, 800-1200 nm. In some embodiments, the top surface of the nodes and the top surface of the kinks are coplanar, that is, the height between the base plane and the top surface of the nodes and the height between the base plane and the top surface of the links is the same.

A ratio of a total area of the top surface of the nodes and the top surface of the links to a total area of the top surface of the nodes, the top surface of the links, the projection area of the sidewalls of the nodes and links to the base plane, and the base areas can be in the range of 30%-80%, such as 40%-70%, 50%-60%.

Preferably, the inclination angle of the sidewalls of the nodes and the inclination angle of the two sidewalls of the links to the base plane are in the range of $$\left[\frac{\pi}{2} - \theta_c, \theta_c\right],$$

where $\theta_c$ is the critical angle in a semiconductor structure to be formed on the nodes and the links on a patterned substrate for the light emitted in the semiconductor structure. Optionally, the inclination angles are in the range of 35-55°, or 37-53°.

The top surface of the nodes can be of a regular hexagon shape, a regular pentagon shape, a square shape, or a circular shape. When the top surface of the nodes is of a regular hexagon shape, each node has six sidewalls downwardly extending from the six edges of the top surface, respectively. Six links connect to the six sidewalls of each of the nodes, respectively, as shown in FIGS. 5A and 5B, or six links connect to six side edges between the six sidewalls, respectively, as shown in FIG. 8. The side edge is formed between two adjacent sidewalls. When the top surface of the nodes is of a circular shape, four, five, or six links can connect to the sidewall of each of the nodes, respectively, and are distributed evenly along a circumference of the top surface. FIGS. 7A and 7B show an embodiment where the top surface of the nodes is of a circular shape and six links connect to the sidewall of each of the nodes, respectively.

In some embodiments, the nodes can reduce to the size of the links. In other words, the nodes vanish, only intercrossed links remain. For example, when the top surface of the nodes is of a regular hexagon shape with six equal edges, the length of the edge of the hexagon top surface can be made equal to the width of the top surface of the links, and six links connect to six sidewalls of each of the nodes, respectively. In this embodiment, the nodes vanish and the pattern of the links on the substrate looks like the one shown in FIGS. 10A and 10B.

Similarly, when the top surface of the nodes is of a regular pentagon shape with five equal edges, the length of the edge of the pentagon top surface can be made equal to the width of the top surface of the links, and five links connect to five sidewalls of each of the nodes, respectively. When the top surface of the nodes is of a square shape with four equal edges, the length of the edge of the square top surface can be made equal to the width of the top surface of the links, and four links connect to four sidewalls of each of the nodes, respectively.

In the above embodiments, the nodes and the links protrude outwardly from a surface of the substrate. Those nodes and links are protrusion nodes and links. The nodes and links also can be concave nodes and concave links, this is, the nodes and links cut into the surface of the substrate, forming voids of a shape being mirror symmetrical to the shape of the protrusion nodes and links in the above embodiments.

In some embodiments, the substrate for light emitting diode includes a plurality of concave nodes and concave links cutting into a surface of the substrate and base areas on the surface of the substrate. Each pair of adjacent concave nodes is connected by a corresponding concave link, respectively.

Each concave node has a bottom surface and one or more sidewalls upwardly extending from the edge of the bottom surface, the one or more sidewalls have an inclination angle with respect to the base plane of the substrate. Each concave link has a bottom surface of a rectangular shape and two sidewalls upwardly extending from two edges of the bottom surface, the two sidewalls have an inclination angle with respect to the base plane of the substrate, and the two sidewalls of the concave links connect to the sidewalls of the concave nodes, respectively. Preferably, the inclination angle of the concave nodes equals to the inclination angle of the concave links and is in the range of $$\left[\frac{\pi}{2} - \theta_c, \theta_c\right],$$

where $\theta_c$ is the critical angle in a semiconductor structure to be formed on the concave nodes and the concave links on a patterned substrate for the light emitted in the semiconductor structure. Optionally, the inclination angles are in the range of 35-55°, or 37-53°. The sidewalls of the nodes and the links may have a substantially flat surface. The bottom surface of the concave nodes and the concave links can be a flat surface parallel with the base plane of the substrate.

The area of the bottom surface of each of the concave nodes is in the range of 0.01-12.56 µm², the width of the bottom surface of the concave links is in the range of 100-500 nm, such as 150-450 nm, 200-400 nm, 250-350 nm, the length of the bottom surface of the concave links is in the range of 300-3000 nm, such as 500-2500 nm, 1000-2000 nm, a height between the base plane and the bottom surface of the concave nodes is in the range of 200-2000 nm, such as 500-1500 nm, 800-1200 nm, and a height between the base plane and the bottom surface of the concave links is in the range of 200-2000 nm, such as 500-1500 nm, 800-1200 nm. Preferably, the bottom surface of the concave nodes and the bottom surface of the concave links are coplanar.

The ratio of a total area of the bottom surface of the concave nodes and the bottom surface of the concave links to a total area of the bottom surface of the concave nodes, the bottom surface of the concave links, the projection area of the sidewalls of the nodes and links to the base plane, and the base areas is in the range of 30%-80%, such as 40%-70%, 50%-60%.

In some embodiments, the concave links have the same size and shape, the concave nodes have the same size and shape and are evenly distributed in the substrate. The bottom surface of the concave nodes can be of a regular hexagon shape, a regular pentagon shape, a square shape, or a circular shape.

When the bottom surface of the concave nodes is of a regular hexagon shape, the sidewalls of six concave links connect to six sidewalls of each of the concave nodes, respectively, or the sidewalls of six concave links connect to six side edges between the six sidewalls of the concave nodes, respectively. When the bottom surface of the concave nodes is of a circular shape with a sidewall upwardly extending from the edge of the bottom surface, the sidewalls of six concave links connect to the sidewall of each of the concave nodes, respectively, and are distributed evenly along a circumference of the bottom surface of the concave nodes.

In some embodiments, the concave nodes reduce to the size of the concave links and vanish. For example, when the bottom surface of the concave nodes is of a regular hexagon shape with six equal edges, the length of the edge of the bottom surface of the concave nodes is equal to the width of the bottom surface of the concave links, and six concave links connect to each of the concave nodes, respectively, with sidewalls of the concave nodes vanished. When bottom surface of the concave nodes is of a regular pentagon shape with five equal edges, the length of the edge of the bottom surface of the concave nodes is equal to the width of the bottom surface of the concave links, and five concave links connect to each of the concave nodes, respectively, with sidewalls of the concave nodes vanished. When the bottom surface of the concave nodes is of a square shape with four equal edges, the length of the edge of the bottom surface of the concave nodes is equal to the width of the bottom surface of the concave links, and four concave links connect to each of the concave nodes, respectively, with sidewalls of the concave nodes vanished.

Figure 11:
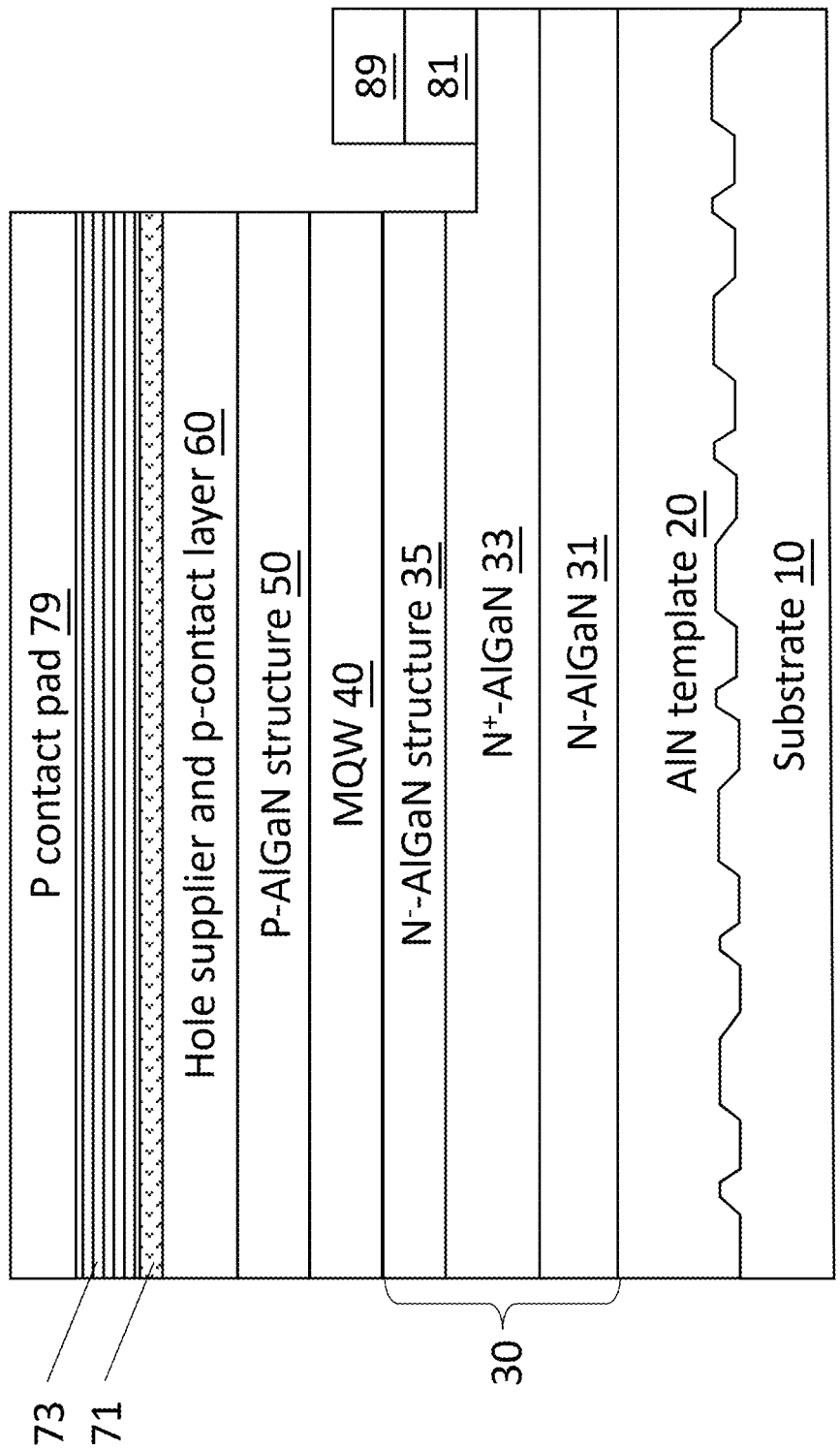
FIG. 11 illustrates a UV LED epitaxial layered structure according to an embodiment of the present invention.

Illustrated in FIG. 11 is a cross-sectional schematic view of a UV LED structure formed over a patterned substrate 10 according to an embodiment of the present invention. Substrate can be selected from substrates 10A, 10B, or 10C, made from c-plane sapphire, AlN, SiC, and the like. Formed over substrate 10 is a template 20, which can be made of a thick AlN layer, for example, with a thickness of 2.0-6.0 μm to fully coalesce on the substrate 10. Even though not shown in FIG. 1, a strain management structure such as an Al-composition grading AlGaN layer or sets of AlN/AlGaN superlattices can be formed over template 20. Formed over template 20 is a thick n-AlGaN structure 30 for electron supply and n-type ohmic contact formation. Structure 30 may include a thick (2.0-5.0 μm such as 3.0 μm, n=2.0× $10^{18}$–5.0×$10^{18}$ cm$^{-3}$) n-type N-AlGaN layer 31 for current spreading, a heavily n-type doped (0.2-0.8 μm such as 0.60 μm, n=8×$10^{18}$–2×$10^{19}$ cm$^{-3}$) N$^+$-AlGaN layer 33 for MQW active-region polarization field screening, and a lightly doped N$^-$-AlGaN layer 35 (0.1-0.5 μm such as 0.3 μm, n=2.5×$10^{17}$–2×$10^{18}$ cm$^{-3}$) to reduce current crowding and prepare uniform current injection into the following Al$_b$Ga$_{1-b}$N/Al$_w$Ga$_{1-w}$N MQW active-region 40. MQW 40 is made of alternatingly stacked n-Al$_b$Ga$_{1-b}$N barrier and well for a few times, for example, for 3-8 times. The barrier thickness is in the range of 8-16 nm, and the well thickness is 1.2-5.0 nm. The total thickness of MQW 40 is usually less than 200 nm, for example, being 75 nm, 100 nm, or 150 nm. The n-Al$_b$Ga$_{1-b}$N barrier and Al$_w$Ga$_{1-w}$N well may have an Al-composition in the range of 0.3-1.0, and 0.0-0.85, respectively, and the Al-composition difference of the barrier and well is at least 0.15, or so to ensure a barrier-well bandgap width difference ($\Delta E_g$) at least 400 meV to secure quantum confinement effect. Following MQW 40 is a p-type AlGaN structure 50. Structure 50 can be a p-AlGaN layer of uniform or varying Al-composition, or a p-AlGaN superlattice structure, or a p-AlGaN MQW structure, or a p-AlGaN multilayer structure serving as hole injecting and electron blocking layer. Structure 50 has enough Al-composition and modulation to allow for sufficient electron blocking and hole injection efficiencies. Further, structure 50 is also efficient in spreading hole current laterally. Formed on top of structure 50 is a hole supplier and p-contact layer 60, which can be a p-AlGaN layer with grading Al-content, or a p-AlGaN layer engineered according to U.S. Pat. No. 10,276,746, the content of which is herewith incorporated by reference in its entirety. Briefly, p-contact layer 60 can be a thin (0.6-10 nm), strained, and heavily acceptor-doped nitride layer (e.g. Mg-doped, to a concentration about $10^{20}$ cm$^{-3}$ or more). For UVB/UVC LEDs (emissions from 200 nm-315 nm), p-contact layer 60 prefers to be a Mg-doped AlGaN layer with Al-composition larger than 0.7, or with Al-composition to be from 0.7 to 1.0. If MQW active-region 40 emits longer wavelength emissions, for example UVA emissions (315 nm-400 nm), or visible emissions, p-contact layer 60 can have less Al-composition. Formed on p-contact layer 60 is a p-ohmic contact 71, which optionally to be a p-ohmic contact and reflector as well. For example, layer 71 can be rhodium layer, or a palladium layer. Optionally, formed on p-ohmic contact 71 is a metal reflector layer 73, which can be selected from metals Al, Rh, Pd, and Mo et al. Optionally, layer 73 is UV-reflective, for example, UVC-reflective, to maximize light extraction efficiency. Formed on layer 73 is a thick metal layer serving as p-contact pad 79, which can be made of a 2-8 μm gold layer or gold tin layer.

Also formed on N-AlGaN structure 30 is an n-ohmic contact 81, which can be made of thin metal layer stacks such as titanium/aluminum/titanium/gold (Ti/Al/Ti/Au) with respective layer thickness of 30-40/70-80/10-20/80-100 nm, for example 35/75/15/90 nm, or V/Al/V/Ag, V/Al/V/Au, and V/Al/Ti/Au, of respective thicknesses such as 20/60/20/100 nm. As seen from FIGS. 11 and 2, n-ohmic contact 81 is preferred to be formed on the heavily n-type doped N$^+$-AlGaN layer 33. Overlying n-ohmic contact 81 is n-contact pad 89 made of a thick (2-10 μm) gold or gold tin layer.

During operation, electrons and holes will be injected into the MQW active-region 40 respectively from the N- and P-AlGaN structures 30 and 50, to radiatively recombine and emit UV light. The UV light will be imping on the interface between AlN template 20 and patterned substrate 10. And the substrate surface patterns formed according to the teachings given in this disclosure will enhance light extraction efficiency from AlN template 20 into substrate 10, while maintaining easy coalescence for AlN template 20 on patterned substrate 10.

The present invention has used UV LEDs as exemplary embodiments. However, it is to be understood that the scope of the present invention is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

What is claimed is:

1. A substrate for light emitting diode, comprising base areas and a plurality of nodes and links protruding from a base plane of the substrate, wherein each pair of adjacent nodes is connected by a corresponding link, respectively, and the base areas are defined and exposed by the nodes and the links, wherein:

each node has a top surface and one or more sidewalls, the one or more sidewalls have an inclination angle with respect to the base plane of the substrate;

each link has a top surface of a rectangular shape and two sidewalls, the two sidewalls have an inclination angle with respect to the base plane of the substrate, and the links connect to the sidewall of the nodes, respectively;

wherein an area of the top surface of each of the nodes is in the range of 0.01-12.56 $\mu m^2$, a width of the top surface of each of the links is in the range of 150-500 nm, a length of the top surface of each of the links is in the range of 500-3000 nm, a height between the base, plane and the top surface of the nodes is in the range of 500-2000 nm, and a height between the base plane and the top surface of each of the links is in the range of 500-2000 nm; and a ratio of a total area of the top surface of the nodes and the top surface of the links to a total area of the top surface of the nodes, the top surface of the links, a projection area of the sidewalls of the nodes and the links to the base plane, and the base areas is in the range of 30%-80%.

2. The substrate of claim 1, wherein the substrate is made of sapphire and the inclination angle of the sidewalls of the nodes is in the range of 35-55°.

3. The substrate of claim 1, wherein the substrate is made of sapphire and the inclination angle of the sidewalls of the links is in the range of 35-55°.

4. The substrate of claim 1, wherein the links have the same size and shape, the nodes have the same size and shape, and are evenly distributed on the substrate.

5. The substrate of claim 4, wherein the top surface of the nodes is of a regular hexagon shape, a regular pentagon shape, a square shape, or a circular shape with an edge length or a diameter of the top surface in the range of 100-2000 nm.

6. The substrate of claim 5, wherein the top surface of the nodes is of a regular hexagon shape and is coplanar with the top surface of the links, six links connect to six sidewalls of each of the nodes, respectively, or six links connect to six edges between the six sidewalls, respectively.

7. The substrate of claim 5, wherein the top surface of the nodes is of a circular shape and is coplanar with the top surface of the links, six links connect to the sidewall of each of the nodes, respectively, and are distributed evenly along a circumference of the top surface of the nodes.

8. The substrate of claim 5, wherein the top surface of the nodes is of a regular hexagon shape with six equal edges and is coplanar with the top surface of the links, a length of the edge of the top surface of the nodes is equal to the width of the top surface of the links, and six links connect to six sidewalls of each of the nodes, respectively, or the top surface of the nodes is of a regular pentagon shape with five equal edges and is coplanar with the top surface of the links, a length of the edge of the top surface of the nodes is equal to the width of the top surface of the links, and five links connect to five sidewalls of each of the nodes, respectively, or the top surface of the nodes is of a square shape with four equal edges and is coplanar with the top surface of the links, a length of the edge of the top surface of the nodes is equal to the width of the top surface of the links, and four links connect to four sidewalls of each of the nodes, respectively.

9. A UV light emitting diode formed on the substrate of claim 1.

10. A substrate for light emitting diode, comprising a plurality of concave nodes and concave links cutting into a surface of the substrate and base areas on the surface of the substrate, wherein each pair of adjacent concave nodes is connected by a corresponding concave link, respectively, wherein:

each concave node has a bottom surface and one or more sidewalls, the one or more sidewalls have an inclination angle with respect to a base plane of the substrate;

each concave link has a bottom surface of a rectangular shape and two sidewalls, the two sidewalls have an inclination angle with respect to the base plane of the substrate, and the two sidewalls of the concave links connect to the sidewalls of the concave nodes, respectively;

an area of the bottom surface of each of the concave nodes is in the range of 0.01-12.56 $\mu m^2$, a width of the bottom surface of the concave links is in the range of 100-450 nm, a length of the bottom surface of the concave links is in the range of 300-3000 nm, a height between the base plane and the bottom surface of the concave nodes is in the range of 200-800 nm, and a height between the base plane and the bottom surface of the concave links is in the range of 200-800 nm; and a ratio of a total area of the bottom surface of the concave nodes and the bottom surface of the concave links to a total area of the bottom surface of the concave nodes, the bottom surface of the concave links, a projection area of the sidewalls of the nodes and links to the base plane, and the base areas is in the range of 30%-80%.

11. The substrate of claim 10, wherein the concave links have the same size and shape, the concave nodes have the same size and shape and are evenly distributed in the substrate.

12. The substrate of claim 11, wherein the bottom surface of the concave nodes is of a regular hexagon shape, a regular pentagon shape, a square shape, or a circular shape with an edge length or a diameter of the bottom surface in the range of 100-2000 nm.

13. The substrate of claim 12, wherein the bottom surface of the concave nodes is of a regular hexagon shape and is coplanar with the bottom surface of the concave links, the sidewalls of six concave links connect to six sidewalls of each of the concave nodes, respectively, or the sidewalls of six concave links connect to six side edges between the six sidewalls, respectively.

14. The substrate of claim 12, wherein the bottom surface of the concave nodes is of a circular shape and is coplanar with the bottom surface of the concave links, the sidewalls of six concave links connect to the sidewall of each of the concave nodes, respectively, and are distributed evenly along a circumference of the bottom surface of the concave nodes.

15. The substrate of claim 12, wherein the bottom surface of the concave nodes is of a regular hexagon shape with six equal edges and is coplanar with the bottom surface of the concave links, a length of the edge of the bottom surface of the concave nodes is equal to the width of the bottom surface of the concave links, and six concave links connect to each of the concave nodes, respectively, with sidewalls of the concave nodes vanished, or the bottom surface of the concave nodes is of a regular pentagon shape with five equal edges and is coplanar with the bottom surface of the concave links, a length of the edge of the bottom surface of the concave nodes is equal to the width of the bottom surface of the concave links, and five concave links connect to each of the concave nodes, respectively, with sidewalls of the concave nodes vanished, or the bottom surface of the concave nodes is of a square shape with four equal edges and is coplanar with the bottom surface of the concave links, a length of the edge of the bottom surface of the concave nodes is equal to the width of the bottom surface of the concave links, and four concave links connect to each of the concave nodes, respectively, with sidewalls of the concave nodes vanished.

16. A UV light emitting diode formed on the substrate of claim 10.

* * * * *